United States Patent [19]

Baliga

[11] Patent Number: 4,982,258
[45] Date of Patent: Jan. 1, 1991

[54] METAL OXIDE SEMICONDUCTOR GATED TURN-OFF THYRISTOR INCLUDING A LOW LIFETIME REGION

[75] Inventor: Bantval J. Baliga, Schenectady, N.Y.

[73] Assignee: General Electric Company, Schenectady, N.Y.

[21] Appl. No.: 188,888

[22] Filed: May 2, 1988

[51] Int. Cl.$^5$ .................... H01L 29/74; H01L 29/10; H01L 29/78; H01L 27/02
[52] U.S. Cl. ................................ 357/38; 357/23.4; 357/43; 357/55; 357/64
[58] Field of Search .................. 357/23.4, 23.12, 34, 357/39, 38, 64, 55, 38 T, 23.4, 38, 64

[56] References Cited

U.S. PATENT DOCUMENTS

| 4,259,683 | 3/1981 | Adler et al. | 357/64 |
| 4,281,336 | 7/1981 | Sommer et al. | 357/64 |
| 4,437,107 | 3/1984 | Johnson et al. | 357/38 |
| 4,568,958 | 2/1986 | Baliga | 357/23.4 |
| 4,752,818 | 6/1988 | Kushida et al. | 357/64 |
| 4,760,432 | 7/1988 | Stoisiek et al. | 357/38 |
| 4,782,379 | 11/1988 | Baliga | 357/38 |
| 4,799,095 | 1/1989 | Baliga | 357/55 |
| 4,827,321 | 5/1989 | Baliga | 357/55 |

FOREIGN PATENT DOCUMENTS

| 0049445 | 4/1982 | European Pat. Off. | 357/38 T |
| 0002077 | 1/1979 | Japan | 357/38 T |
| 0088361 | 7/1981 | Japan | 357/38 T |

Primary Examiner—Rolf Hille
Assistant Examiner—D. M. Ostrowski
Attorney, Agent, or Firm—Robert Ochis; James C. Davis, Jr.; Marvin Snyder

[57] ABSTRACT

In a depletion mode thyristor of the type including a regenerative portion and a non-regenerative portion, the turn-off time for the thyristor is substantially reduced without producing a corresponding increase in the on-resistance of the device by providing a region of relatively low carrier lifetime in the non-regenerative portion of the device in the layer or layers in which charge storage limits the turn-off time for the device. Turn-off of the thyristor is accomplished by pinching off the regenerative portion, thereby diverting current into the low carrier lifetime non-regenerative portion.

19 Claims, 5 Drawing Sheets

METAL OXIDE SEMICONDUCTOR GATED TURN-OFF THYRISTOR INCLUDING A LOW LIFETIME REGION

RELATED APPLICATIONS

This application is related to a U.S. patent application entitled "Metal Oxide Semiconductor Gated Turn-Off Thyristor", Ser. No. 069,806, filed July 6, 1987 and U.S. patent application entitled "Metal Oxide Semiconductor Gated Turn-Off Thyristor Including a Schottky Contact", Ser. No. 114,357, filed Oct. 29, 1987, both by Bantval J. Baliga, the present inventor, and U.S. patent application entitled "Metal Oxide Semiconductor Gated Turn-Off Thyristor Having an Interleaved Structured", Ser. No. 188,887, filed May 2, 1988 by Hsueh-Rong Chang and Bantval J. Baliga, assigned to the instant assignee. The present invention is an improvement on the inventions described and claimed in those applications. Each of these related applications is incorporated herein, by reference, in its entirety.

FIELD OF THE INVENTION

The present invention relates to four-layer, latching, semiconductor power devices and more particularly, to such devices whose conduction and/or turn-off may be controlled by voltage on the gate electrode of a metal oxide semiconductor (MOS) portion of the device.

Prior art MOS gated four-layer (NPNP) semiconductor devices which will latch into an on condition when conducting sufficient current suffer from the disadvantage of having substantial quantities of minority carriers stored in their internal structure at the time of an abrupt turnoff of a high level on-state current. In order to provide devices having low on-resistance, the lifetime of the carriers in the device structure is made as long as possible. As a consequence, the stored charge which is present in the device before turn-off and which is trapped in the device during turn-off requires a substantial period of time to dissipate by recombination. The resulting high minority carrier concentration during device turn-off transients severely limits the safe operating area or SOA of such a device. Therefore, it is apparent that latching NPNP semiconductor devices having both very low ON-resistances and large SOAs are desirable.

Accordingly, it is a primary object of the present invention to provide an improved MOS-gated latching NPNP semiconductor device having a low on-resistance and a large SOA.

It is another object to provide a latching NPNP semiconductor device which turns off rapidly.

It is still another object to provide an NPNP semiconductor device having a low on-resistance and short turn-off time.

SUMMARY OF THE INVENTION

In accordance with the present invention, the foregoing objects are achieved by a semiconductor device having a regenerative or thyristor structure including first, second, third and fourth regions of alternating conductivity types arranged in series in that order and a three layer non-regenerative structure disposed adjacent the regenerative structure. Within the non-regenerative portion of the structure, the middle one of the three layers of the non-regenerative structure includes a region or portion having a relatively low lifetime. This device also includes an MOS gate electrode disposed adjacent to the second or third region of the regenerative portion in a configuration which enables the application of an appropriate gate bias voltage to the gate electrode to pinch off that second or third region and to force current flow to transfer from the regenerative portion of the structure to the non-regenerative portion of the structure. When such a current transfer takes place, the charge stored within the middle layer of the three layer structure is rapidly dissipated within the low lifetime portion of that layer because of rapid carrier recombination. That middle layer is preferably continuous with the one of the second and third regions of the regenerative structure which is of the same conductivity type, with the result that charge stored within the regenerative structure is rapidly dissipated by recombination in that low lifetime region.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
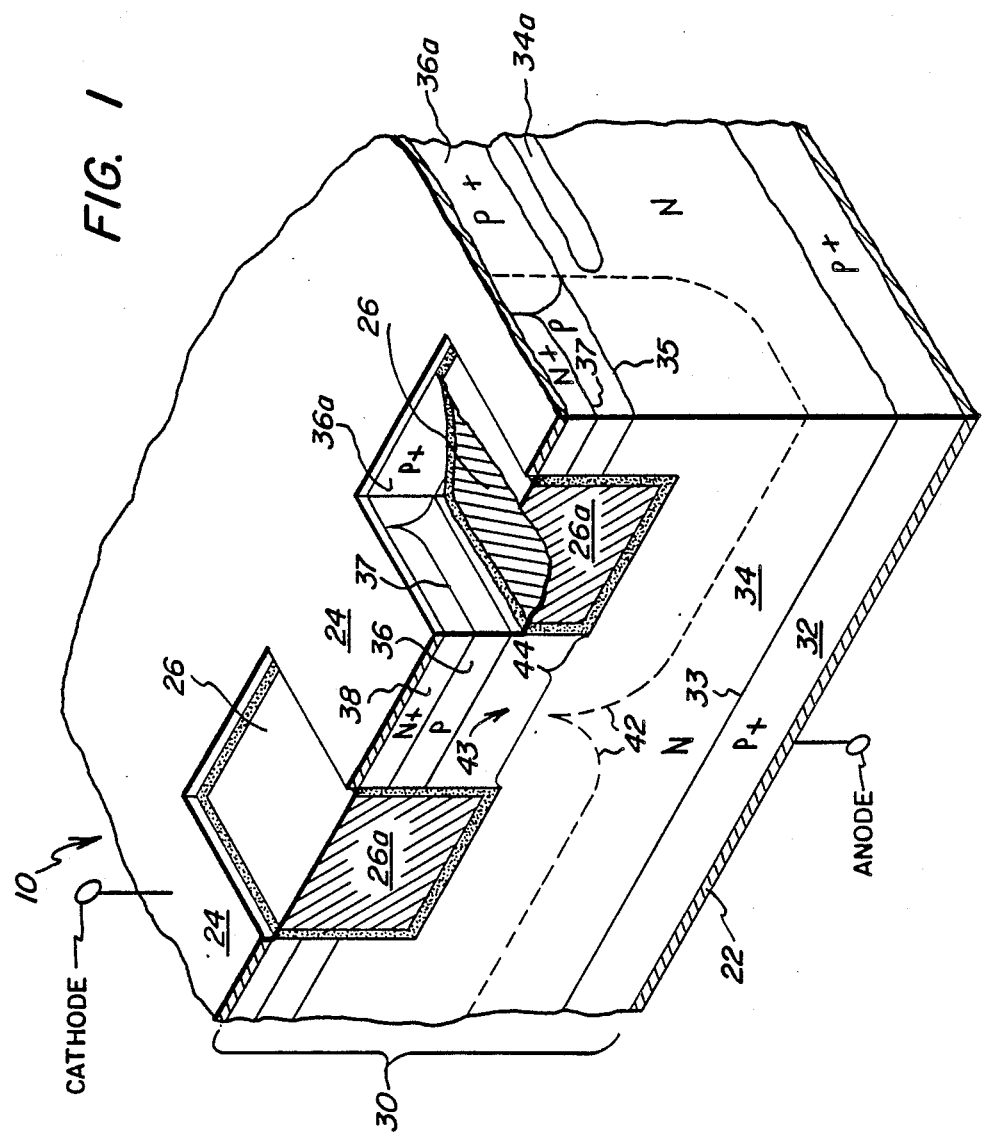
FIG. 1 is a sectional, partially cutaway, perspective view of a semiconductor structure in accordance with the present invention.

In FIG. 1, a depletion mode thyristor (DMT) 10 in accordance with the present invention is shown in perspective view. This device includes a body 30 of semiconductor material which includes a first or lower layer 32 of P+ conductivity type material, a second layer 34 of N type conductivity material disposed adjacent to and forming a PN junction 33 with the upper surface of the layer 32. A third layer 36 of P type material is disposed adjacent to the upper surface of the N type layer 34 and forms a second PN junction 35 therewith. A fourth layer 38 of N conductivity material is disposed adjacent to the upper surface of the third layer and forms a third PN junction 37 therewith. Adjacent to this four layer structure within the same semiconductor body is disposed a three layer structure L comprised of the layers 32, 34 and 36a. The layer 36a has a P+ conductivity rather than a P conductivity.

A gate electrode 26 extends into the semiconductor body from the upper surface through the layers 38 and 36 into the layer 34 adjacent to the regenerative portions of the structure. The portions 43 of the layer 34 which extend upward between adjacent gate electrode segments 26a are narrow enough that application of an appropriate negative voltage to the gate electrode relative to the layer 34 will deplete the portion 43 of the layer 34 between those regions thereby pinching off current flow therethrough. Within the non-regenerative portion of the structure, the layer 34 includes a portion 34a which has a substantially lower lifetime than the remainder of the layer 34. This low lifetime portion 34a may be formed in any number of well known ways. These include implantation of protons or of known lifetime killers, typically heavy metal ions such as gold, electron irradiation and so forth. In order to provide a relatively localized low lifetime region as shown in FIG. 1, proton or gold implantation is preferred over electron irradiation since electron irradiation tends to affect carrier lifetime over a large depth. If a uniform reduction in lifetime throughout the three layer or non-regenerative portion of the structure is desired, then electron radiation becomes a preferred method of reducing the lifetime. In those circumstances, the low lifetime region extends the full depth of the semiconductor body from its upper surface to its lower surface rather than being localized in depth as shown in FIG. 1. However, such a full depth reduced lifetime region is preferably still restricted in lateral extent to the non-regenerative portion of the structure.

An anode electrode 22 is disposed in ohmic contact with the lower surface of the P+ region 32 and a cathode electrode 24 is disposed in ohmic contact with the upper surface of the N+ region 38 and the P+ portion 36a of the layer 36. The result is a three electrode structure having power electrodes 22 and 24 and an MOS gate electrode 26 for controlling the conductivity of the device. When the cathode electrode 24 is held at ground voltage and the anode electrode 22 is held at a positive voltage relative to the cathode electrode, this device may be turned on by applying a positive voltage to the gate electrode 26 which is of sufficient magnitude to create an inversion layer in the P region 36 adjacent the gate electrode. Electrons flow from the N+ emitter region 38 through this channel into the N type region 34 where they serve as base current for the PNP transistor formed by layers 32, 34 and 36. The resulting current flow is sufficient to initiate regenerative thyristor action in the four layer structure. Once such action commences, the gate voltage may be removed from the gate electrode 26 without affecting the regenerative action.

While the device is operating in a regenerative mode, a substantial percentage of the current flows vertically through the device between the P+ region 32 and the N+ region 38. Within the regenerative structure, all the regions have high carrier lifetime and the structure produces a low on-resistance. Some carriers will diffuse into the non-regenerative portion of the structure where those carriers reaching the low lifetime region 34a will recombine. The resulting recombination tends to increase the on-resistance of the device, but has little effect because of the relatively small percentage of the carriers which reach the region 34a.

When it is desired to turn the device off, a large negative voltage is applied to the gate electrode 26 relative to the layer 34. As a consequence, depletion regions 2 form around the gate electrode segments 26a. As shown in FIG. 1, the depletion regions from adjacent gate electrode segments merge and pinch off the portion 43 of the region 4. This immediately stops current flow through that portion of the layer 34. However, it has no affect on the ability of the non-regenerative portion of the structure to conduct current. Consequently, the charge stored in the layer 34 is attracted into the non-regenerative portion by the relative potentials within the device and the carriers enter the low lifetime region 34a and rapidly recombine. As a result, the stored carriers are dissipated much more rapidly in this structure than in a similar structure which lacks the low lifetime region 34a. As a consequence, the device of FIG. 1 has a substantially faster switching speed and a higher SOA than the devices disclosed in the related applications cited above.

The region 34a is shown in FIG. 1 as extending to the boundary of the depletion region formed by the gate electrode segments 26a during pinch off. However, the region 34a may be confined within the non-regenerative portion and spaced from those depletion regions or may be larger and extend into the depletion regions. The particular size and location of the region 34a within the non-regenerative portion is a matter of design choice and trade-offs between on-state resistance of the thyristor structure and the time for stored charges to dissipate during turn-off.

Details of device operation and fabrication may be found in the two above-identified related application Ser. Nos. 069,806 and 114,357 which are incorporated herein by reference.

Figure 2:
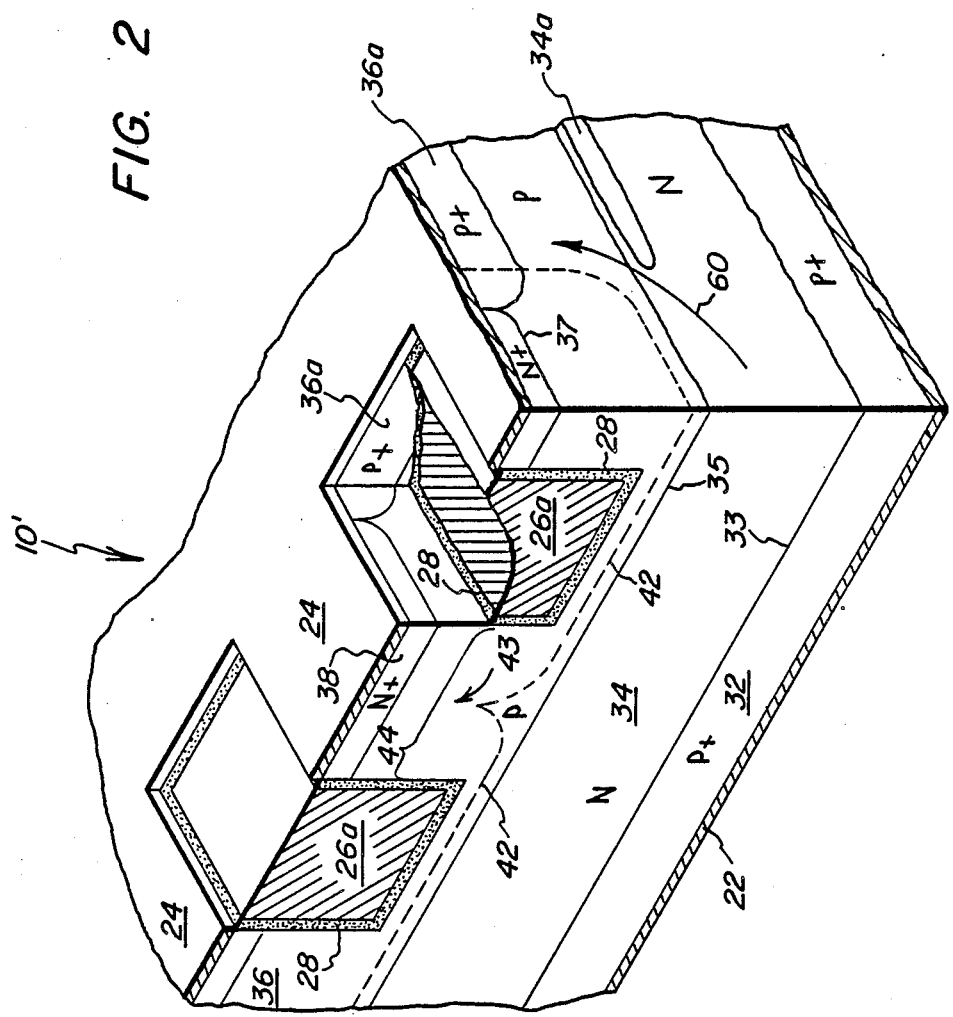
FIG. 2 is a sectional, partially cutaway, perspective view of an alternative embodiment of a semiconductor structure in accordance with the present invention.

Turning now to the device 10' of FIG. 2, this device is similar to the device 10 except for the depth to which the gate segments 26a extend into the structure. In FIG. 2, the P type base region 36 is shown as being substantially thicker than it is in FIG. 1 in order to more clearly illustrate the details of the FIG. 2 structure. In actual device structures, the layer 36 may be of similar thickness in both a device 10 shown in FIG. 1 and the device 10' shown in FIG. 2. In the device shown in FIG. 2, the gate segments 26a extend far enough into the P type base region 36 to enable them to pinch off the P type base region. However, they do not extend into the N type base region 34. The structures are otherwise similar. The low lifetime portion 34a of the N type base region is again located under the P+ portion 36a of the P type base region in the three layer or non-regenerative portions of the structure. This structure differs from that of FIG. 1 in that the region 34a cannot extend to the depletion region induced by the gate electrode unless the region 34a extends into the P type base region. Thus, there is a current path 60 by which carriers can flow around the low lifetime area 34a. However, the existence of that current path has a minor effect during turn-off because the rapid recombination of carriers in the region 34a keeps the carrier concentration therein relatively low compared to the rest of the N type base region until a substantial portion of the stored charge in the N type base region has recombined. Consequently, the stored charge diffuses into the low lifetime region rapidly.

Again, in this embodiment, the particular size and exact location of the low lifetime portion 34a of base region 34 is a matter of design choice and involves tradeoffs between the device on-resistance and device turn-off time.

Figure 3:
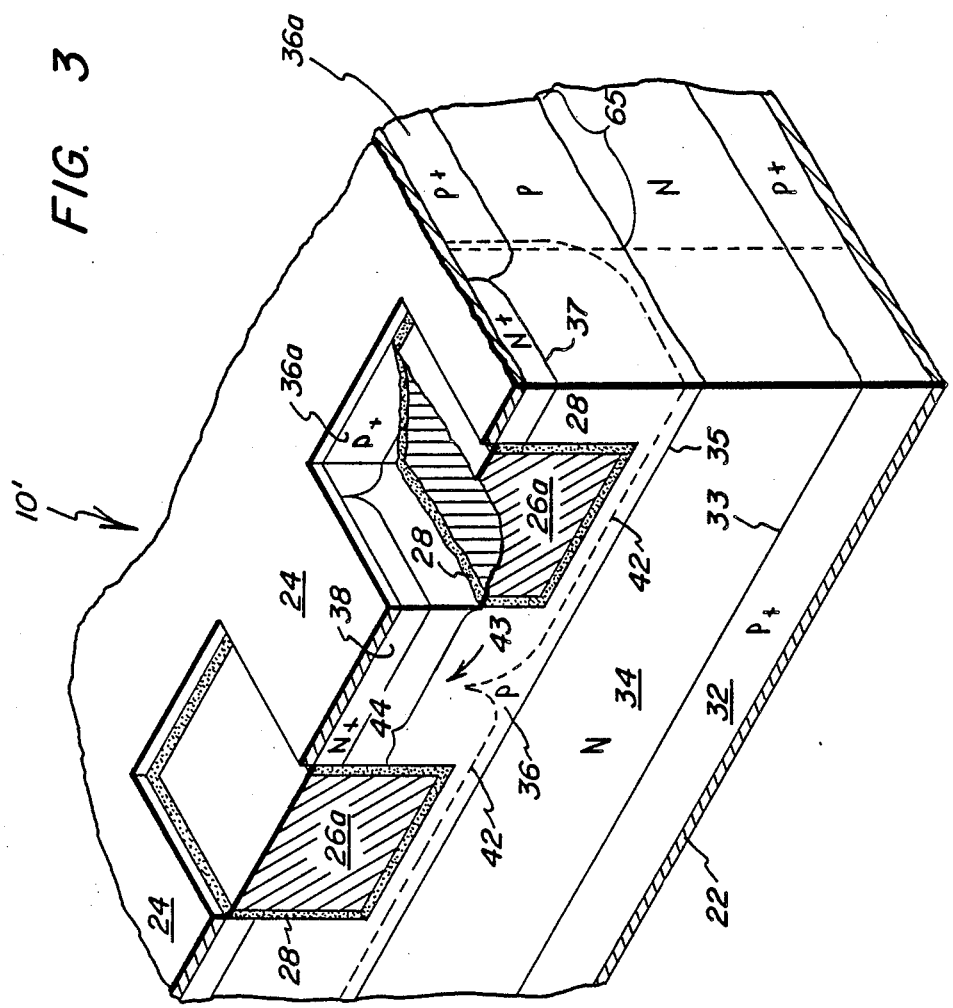
FIG. 3 is a sectional, partially cutaway perspective view of another alternative embodiment of a semiconductor structure in accordance with the present invention.

While the devices shown in FIGS. 1 and 2 and have been described as having low lifetime regions only in the N type base region, it will be understood that low lifetime regions may also be provided in the P type base region in the non-regenerative portion of the device in order to minimize charge storage time in that region as well as in the N type base region. Such a device is shown in FIG. 3 where the low lifetime region 65 extends through regions 32, 34 and 36a in the non-regenerative portion of the structure. A low lifetime region extending over such a range of depths is most easily produced by electron irradiation of that region, although other techniques may be used to produce it.

Figure 4:
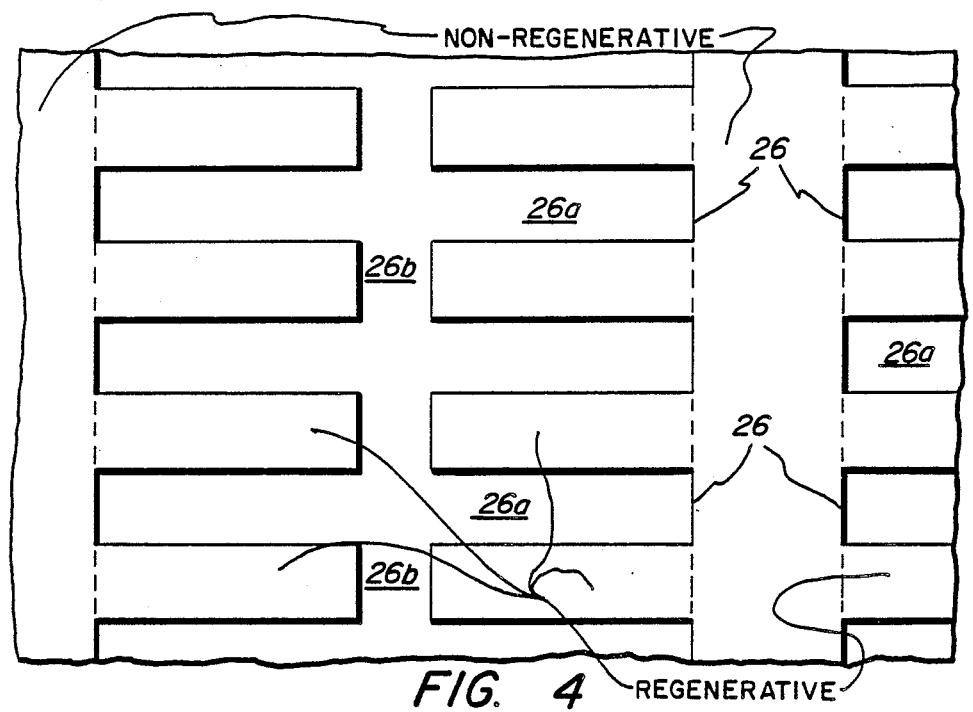
FIGS. 4–6 illustrate three alternative configurations for the plan view of a gate electrode in the devices of FIGS. 1–3.
Figure 5:
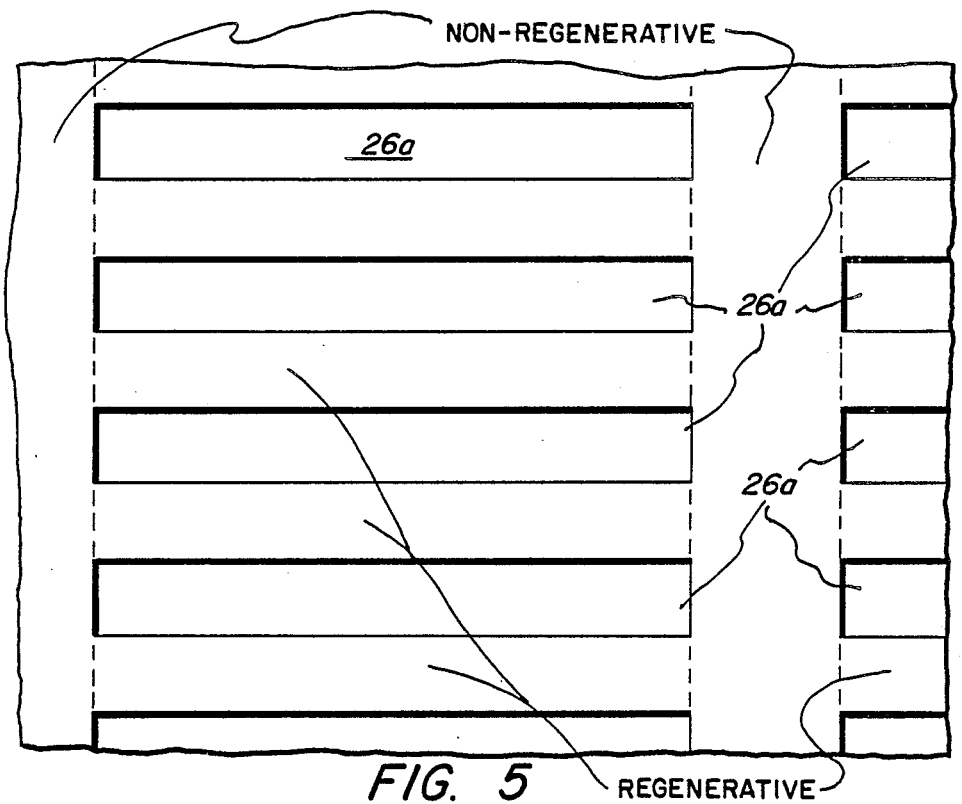
Figure 6:
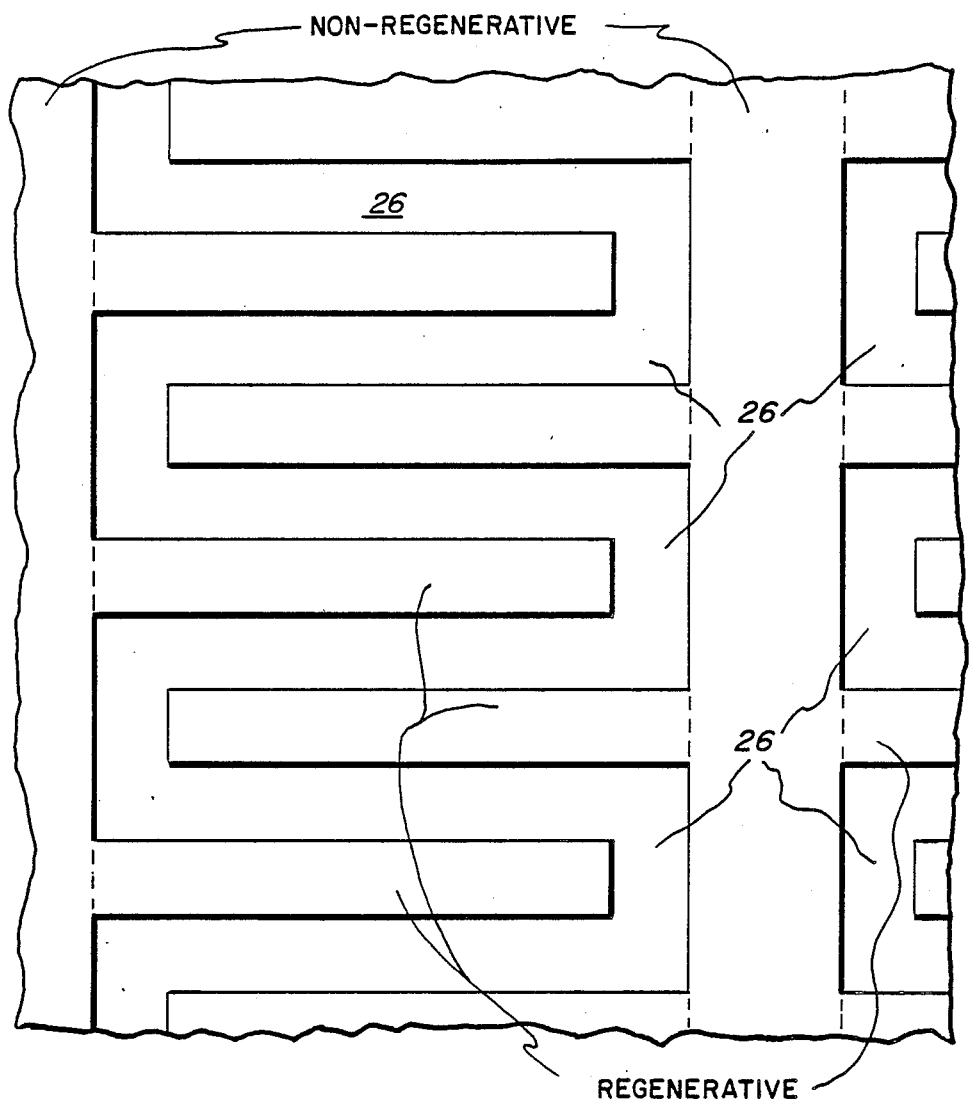

Three of many available alternatives for the plan view configuration of the gate electrode segments which extend into the body of semiconductor material are shown in FIGS. 4–6. In FIG. 4, a structure is illustrated in which the gate has a double sided comb configuration with fingers or tines 26a extending in both directions from a central spine 26b. In FIG. 5, the gate electrode comprises a plurality of spaced apart parallel segments 26a. In FIG. 6, the gate electrode segments 26a have a serpentine configuration.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor device comprising:
   a body of semiconductor material including a regenerative portion and an adjacent non-regenerative portion, said regenerative portion including adjoining first, second, third and fourth regions of alternating conductivity type disposed in series in that order;
   a first power electrode disposed in ohmic contact with said first region;
   a second power electrode disposed in ohmic contact with said fourth region;
   means for pinching off one of said second and third regions in said regenerative portion to divert current from said regenerative portion into said adjacent non-regenerative portion to turn said device off; and
   at least one of said second and third regions having first and second portions, said first portion having a relatively high carrier lifetime and said second portion having a relatively low carrier lifetime, said second portion being primarily disposed within said non-regenerative portion of said device.

2. The semiconductor device recited in claim 1 wherein said second portion of said at least one of said second and third regions comprises a proton implanted region.

3. The semiconductor device recited in claim 1 wherein said second portion of said at least one of said second and third regions comprises a heavy metal ion implanted region.

4. The semiconductor device recited in claim 3 wherein said heavy metal ion comprises gold.

5. The semiconductor device recited in claim 1 wherein said second portion of said at least one of said second and third regions comprises an electron irradiated region.

6. The semiconductor device recited in claim 5 wherein said relatively low carrier lifetime portion of said non-regenerative portion extends through said second and third regions.

7. The semiconductor device recited in claim 6 wherein said relatively low carrier lifetime portion of said non-regenerative portion extends through said first region.

8. The semiconductor device recited in claim 1 wherein said relatively low carrier lifetime portion of said non-regenerative portion extends through said second and third regions.

9. The semiconductor device recited in claim 8 wherein said relatively low carrier lifetime portion of said non-regenerative portion extends through said first region.

10. The semiconductor device recited in claim 1 wherein said means for pinching off one of said second and third regions comprises an insulated gate extending into said body of semiconductor material from a first surface thereof in a configuration to define portions of said one of said second and third regions in said regenerative portion which are narrow enough that application of an appropriate bias voltage to said insulated gate electrode depletes said narrow portions and pinches off current flow through said one of said second and third regions in said regenerative portion without pinching off said non-regenerative portion.

11. The semiconductor device recited in claim 10 wherein said insulated gate extends into said one of said second and third regions and is spaced from the other of said second and third regions.

12. The semiconductor device recited in claim 10 wherein said insulated gate structure extends into said one of said second and third regions and extends through the other of said second and third regions.

13. The semiconductor device recited in claim 10 wherein, in a plane parallel to said first surface, said insulated gate is of comb-like configuration, having a spine with a plurality or tines extending therefrom.

14. The semiconductor device recited in claim 10 wherein, in a plane parallel to said first surface, said insulated gate includes a plurality of spaced apart, substantially parallel fingers.

15. The semiconductor device recited in claim 1 wherein:
   said non-regenerative portion includes only said second, third and fourth regions; and
   in said non-regenerative portion of said device, said first power electrode is disposed in ohmic contact with said second region.

16. The semiconductor device recited in claim 1 wherein:
   said body of semiconductor material includes first and second opposed major surfaces;
   said first power electrode is disposed on said first surface and said second power electrode is disposed on said second surface;
   said non-regenerative portion includes only said first, second and third regions;
   said second power electrode is disposed in ohmic contact with said third region in said non-regenerative portion of said device;
   said second surface includes a plane portion and a trench portion, said trench portion comprising a surface of a plurality of trenches which extend into said body from said plane portion;
   a portion of said third region extends to said trench portion of said second surface; and
   each of said trenches contains a segment of said insulated gate electrode therein disposed adjacent to a respective portion of said third region which extends to said trench portion of said second surface.

17. The semiconductor device recited in claim 13 wherein:
   said second region extends to said trench portion of said second surface; and
   said insulated gate electrode segment disposed in each of said trenches is also situated adjacent to said second region.

18. The semiconductor device recited in claim 17 wherein said second region comprises a relatively wide base region and said third region comprises a relatively narrow base region.

19. The semiconductor device recited in claim 16 wherein said second region comprises a relatively narrow base region and said third region comprises a relatively wide base region.

* * * * *